(12) United States Patent
Boucheron et al.

(10) Patent No.: US 6,396,702 B1
(45) Date of Patent: *May 28, 2002

(54) CONTROL MODULE FOR A MOTOR VEHICLE CAB

(75) Inventors: Jean-Louis Boucheron, Savigny le Temple; Emmanuel Fargues, Paris, both of (FR)

(73) Assignee: Valeo Electronique, Creteil (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,740

(22) Filed: Nov. 24, 1998

(30) Foreign Application Priority Data

Nov. 24, 1997 (FR) ............................................. 97 14714

(51) Int. Cl.[7] .................................................. H05K 5/00
(52) U.S. Cl. ........................ 361/752; 361/792; 361/803; 439/76.2
(58) Field of Search ................................ 361/724–730, 361/736, 737, 752, 779, 782, 785, 790–792, 803; 434/76, 76.2, 78, 85

(56) References Cited

U.S. PATENT DOCUMENTS

| 4,944,684 A | * | 7/1990 | Leibowitz | 439/76 |
|---|---|---|---|---|
| 5,040,097 A | * | 8/1991 | Stribel | 361/736 |
| 5,070,258 A | | 12/1991 | Izumi et al. | 327/565 |
| 5,253,143 A | | 10/1993 | Klinger et al. | 361/736 |
| 5,478,244 A | * | 12/1995 | Maue et al. | 439/76.2 |
| 5,541,813 A | * | 7/1996 | Satoh et al. | 361/752 |
| 5,581,130 A | | 12/1996 | Boucheron | 307/10.1 |
| 5,801,925 A | * | 9/1998 | Boada Fonts | 361/752 |

FOREIGN PATENT DOCUMENTS

| DE | 40 28 504 | 3/1991 |
|---|---|---|
| DE | 40 37 603 | 5/1991 |
| EP | 0 567 403 | 10/1993 |
| EP | 0 739 783 | 4/1995 |
| FR | 2 669 179 | 5/1992 |
| FR | 2 746 736 | 10/1997 |
| WO | 91/07865 | 10/1990 |

OTHER PUBLICATIONS

French Search Report dated Aug. 7, 1998; FA SS0060; FR9714714.
"Electronic High–Density Packaging for Under the Hood" *Automotive Engineering* vol. 100, No. 3, MAr. 1, 1992, pp. 13–15.

* cited by examiner

Primary Examiner—Jayprakash N. Gandhi
Assistant Examiner—Tuan Dinh
(74) Attorney, Agent, or Firm—Morgan & Finnegan, LLP

(57) ABSTRACT

A control module for a motor vehicle cab comprising a box, at least one power card and at least one control card placed in said box. The control card extends substantially perpendicularly to the power card, and the box comprises two half-boxes that are closed together and hinged about a hinge. One of the half-boxes has a housing means for receiving tongues and/or female pins which co-operate with the housing means to define connectors, and also having a case which provides protection for the control card.

6 Claims, 4 Drawing Sheets

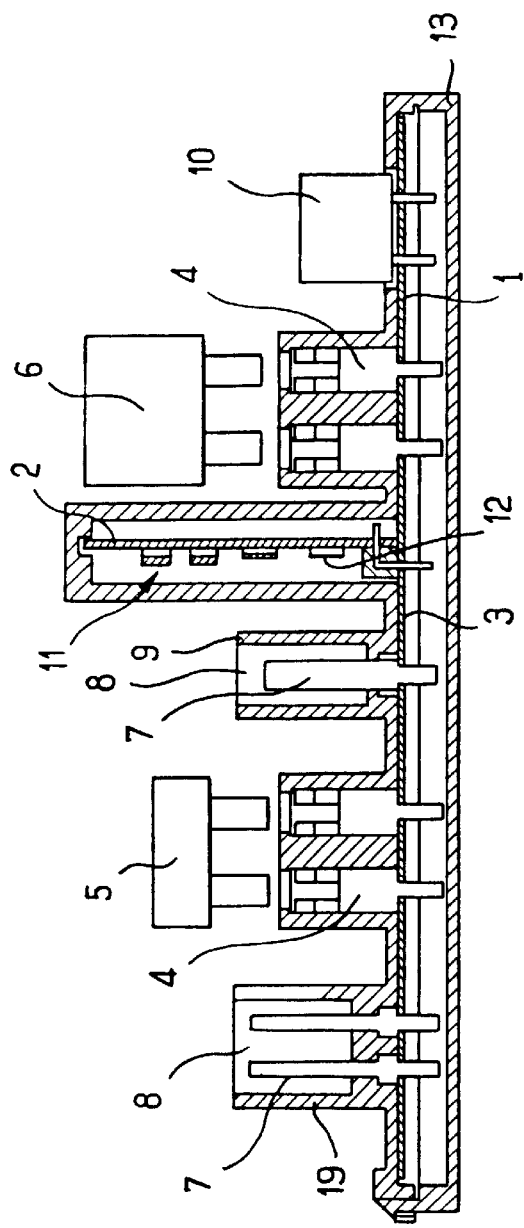
FIG_1
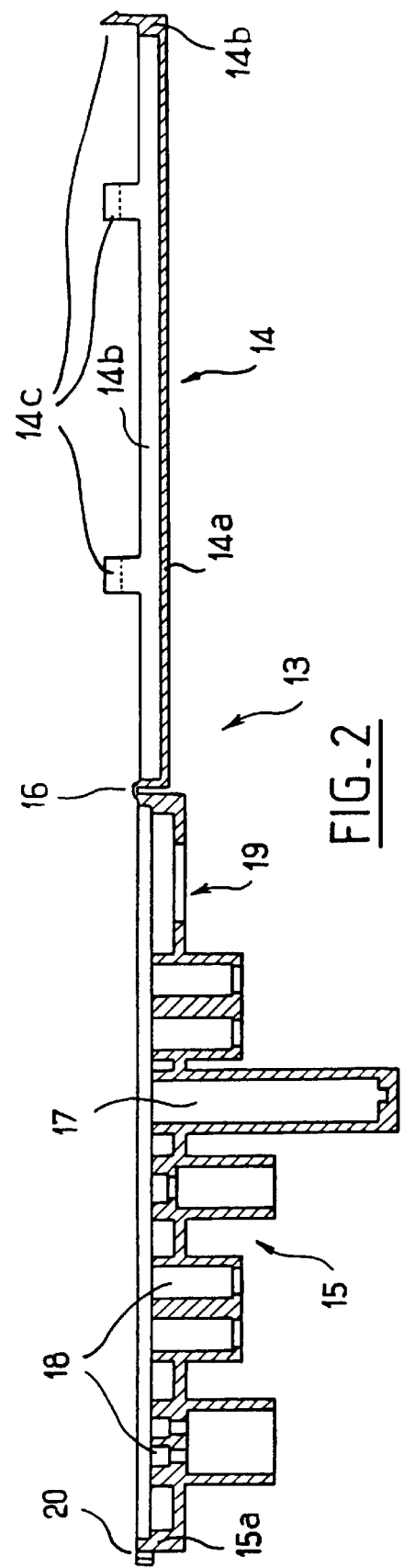
FIG_2

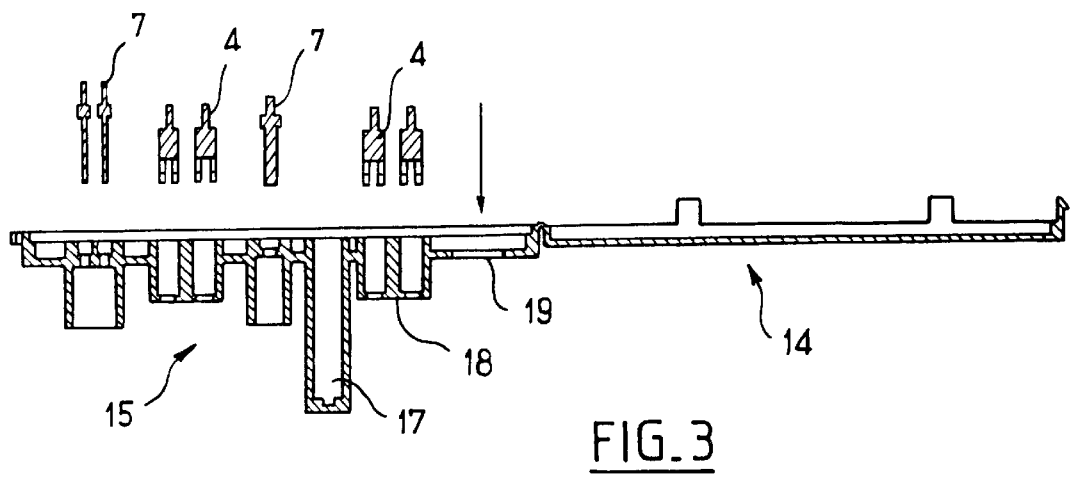
FIG_3
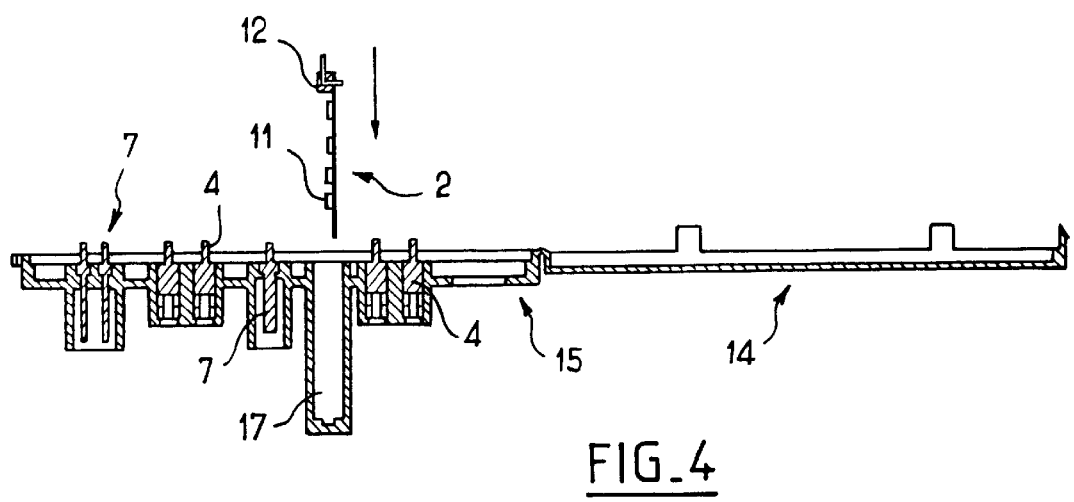
FIG_4
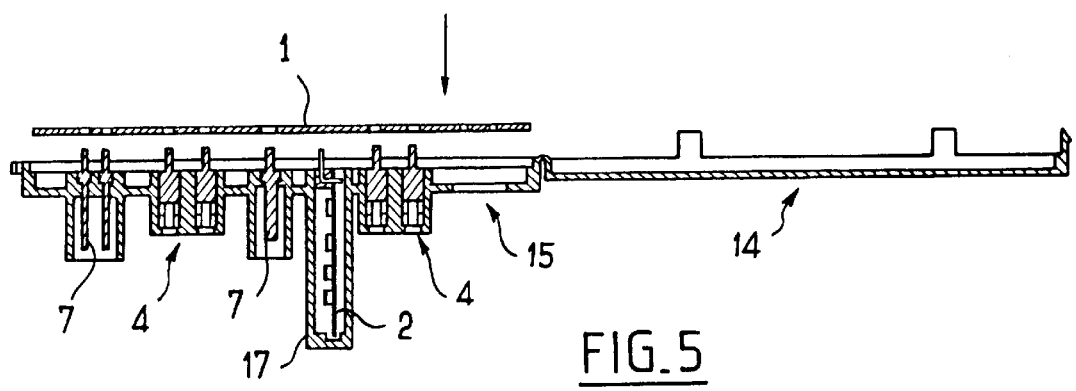
FIG_5

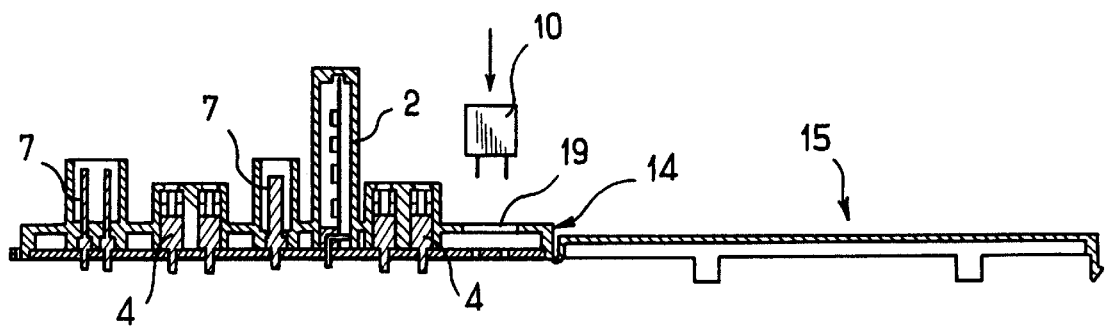
FIG_6
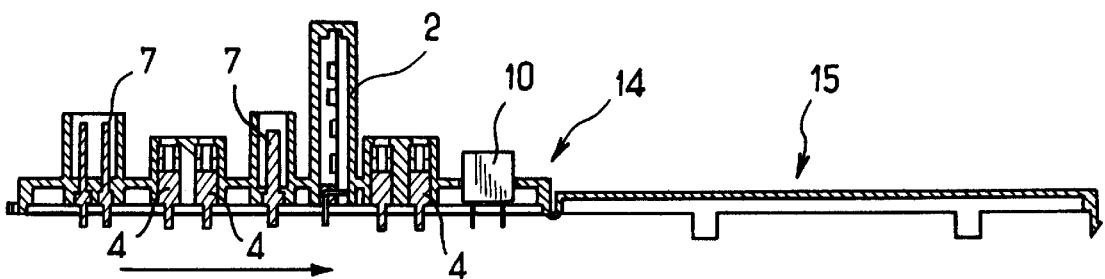
FIG_7

CONTROL MODULE FOR A MOTOR VEHICLE CAB

The present invention relates to control modules for motor vehicle cabs.

More particularly, the invention relates to a control module associating an electronics card for controlling various functions on a vehicle with a power card for protecting controlled circuits, and for relaying and distributing power.

BACKGROUND OF THE INVENTION

The main technological difficulty encountered with control modules of this type lies in providing mechanical and electronic coupling between the power card and the control card.

A power card is a printed circuit designed to protect circuits that switch currents that may be as high as 40 amps or more. They carry protection devices such as fuses and relays, and their substrates and layers of copper need to be thick. The overall thickness of such a copper layer is generally about 200 microns ($\mu$m) to 400 $\mu$m.

A control card carrying control electronics, need only have a substrate that is thin. For example it may be constituted by a single- or double-sided printed circuit with one or two layers of copper that are about 35 $\mu$m thick.

The power card and the control card thus correspond to different manufacturing and connection technologies.

As a result, the two cards, i.e. the power card and the control card, are difficult to connect together.

This difficulty is made worse by the fact that the power card needs to have tracks that are wide so it is not possible to bring its connection points together in a single location since it turns out to be impossible to lay out the tracks of the power card in that way.

DE 40 37 803, and also the article "Electronic high density packaging for under the hood", Automotive Engineering, Vol. 100, No. 3, March 1st, 1992, pp. 13–15, both disclose control modules comprising a single box containing a power card and a control card.

However the control modules described in those two documents do not enable power components to be inserted without opening the box.

Each of the boxes is made up of a plurality of separate parts and consequently requires a plurality of manufacturing molds.

In addition, the structures described in DE 40 37 603 in which an electronics card is disposed perpendicularly to a power card are of considerable bulk and do not provide satisfactory mechanical protection to the electronics card.

OBJECT AND SUMMARY OF THE INVENTION

The object of the present invention is to solve the problem posed by interconnecting the two portions by means of a solution that is simple, low cost, and appropriate.

The invention provides a control module for a motor vehicle cab, the module comprising a box, at least one power card and at least one control card placed in said box, wherein the control card extends substantially perpendicularly to the power card and wherein said box is constituted by two half-boxes that are closed together and hinged about a hinge with which they are integrally formed, one of the half-boxes having means forming housings that receive tongues and/or female pins which co-operate with said housing-forming means to define connectors, and also having a case which provides mechanical protection for the control card.

Said module is advantageously associated with the following various characteristics taken singly or in any technically feasible combination:

- the control card has a plurality of tracks which extend beyond said card, said tracks being carried on said card by zones that are separated by notches, and the power card has a plurality of slots in which said zones carrying said tracks are designed to extend, said power card itself having tracks at said slots to which the tracks of the control card are connected;
- the power card comprises a plurality of superposed single-sided printed circuits;
- the power card comprises a flexible printed circuit; and
- the half-box which includes housing-forming means which receive tongues and/or female pins, and also a case which provides mechanical protection for the control card, also carries at least one housing for a component that is soldered directly to the power card.

The invention also provides a method of making such a module, the method including the various following steps:

- the control card, the tongues, and the female pins are inserted in the housings corresponding thereto in one of the half-boxes;
- thereafter, the power card is put in place on the ends of said tongues and pins and on the control card;
- any optional power components are positioned on said half-box and the power card;
- flow soldering is then performed on the face of the card through which there project the ends of the tongues, the pins, and any power components of the relay type; and
- the two half-boxes are closed together.

The invention also provides a box for a control module of the above-specified type, the box being constituted by two half-boxes that are closed together and hinged about a hinge integrally formed therewith, one of the half-boxes including housing-forming means for receiving tongues and/or female pins which co-operate with said housing-forming means to define connectors, and also a case for providing mechanical protection to the control card.

BRIEF DESCRIPTION OF THE DRAWINGS

The following description is purely illustrative and non-limiting. It should be read with reference to the accompanying drawings, in which:

FIG. 1 is a section view of a module constituting an embodiment of the invention;

FIG. 2 is a section view of the box of the FIG. 1 module;

FIGS. 3 to 7 show various steps in assembling the FIG. 1 module;

MORE DETAILED DESCRIPTION

Figure 8:
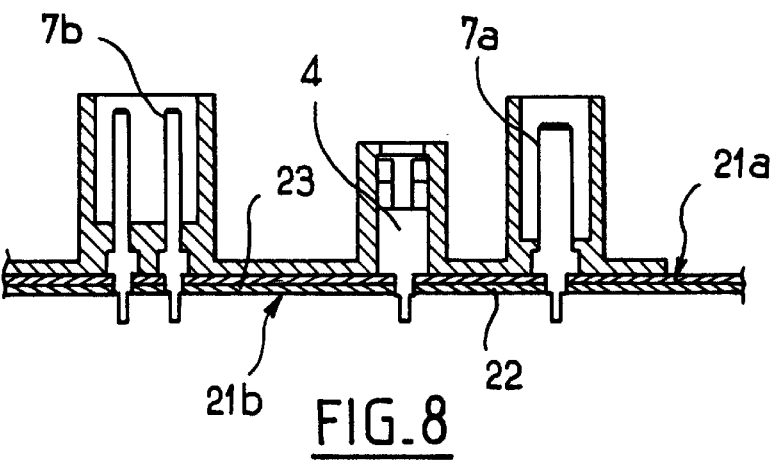
FIG. 8 is a section view showing a possible variant embodiment of the power card of the FIG. 1 module.

The control module shown in FIG. 1 can be a cab computer module and comprise a power card 1 and a control card 2.

The power card 1 has a printed circuit 3 on which there are mounted through elements such as:

- female pins 4 designed to receive fuses 5 and relays 6;
- connection tongues 7 which are disposed inside guide skirts 18 to define connectors 8 serving in particular to connect with power supply terminals at battery voltage or with various controlled members; and one or more power components (relay 10) soldered directly to the printed circuit 3.

By way of example, the printed circuit 3 is a single-sided printed circuit with copper only on that one of its faces through which there project the ends of said through elements 4, 7, and 10.

By way of example, the circuit 3 may be a cutout and overmolded circuit or a printed circuit having a thick layer of copper (e.g. 105 $\mu$m to 400 $\mu$m thick) or indeed it may be a flexible circuit with thick copper. It may have one or more layers.

It is naturally possible to envisage including components of types other than those mentioned above (diodes or other power components, for example).

The control card 2 is constituted by an epoxy-substrate printed circuit carrying a plurality of electronic components 11. In the example shown in FIG. 1, said printed circuit is of the double-sided type, but it could naturally be a single-sided circuit. The layers of copper used have a thickness of 35 $\mu$m.

The control card 2 extends perpendicularly to the plane of the power card 1 and is connected to the printed circuit 3 of said power card 1 via a solderable connector 12 e.g. made up of stiff wires or indeed, as shown in FIG. 1, of angled strips. Other, particularly advantageous variant connection means are described below with reference to FIG. 9.

The power card 1 is received together with the control card 2 in a one-piece box 13 of plastics material which is shaped both to surround the cards 1 and 2 so as to protect them against mechanical stresses or shocks and also to define housings 18 which co-operate with the pins 4 and the tongues 7 to define the connectors of the module.

The box 13 is shown more particularly in FIG. 2. It is constituted by a first half-box 14 (the bottom half-box in FIG. 1) and a second half-box 15 (the top half-box in FIG. 1) which are hinged to each other via a hinge 16 integrally molded with said half-boxes 14 and 15.

The bottom half-box 14 has a flat bottom 14a surrounded by walls 14b and extended by resilient fixing tabs 14c carrying hook-forming projections.

The top half-box 15 has a blind depression 17 which defines the protective case for the controlling control card 2.

It also has housings (skirts 18) bordered by walls which are designed to co-operate with the tongues 7 and the pins 4 to define the connectors of the module.

It also has holes 19 designed to receive components that are soldered directly to the printed circuit 3.

This half-box 15 is also surrounded by a wall 15a whose edge is designed to come into contact with the edge of the wall 14b. This wall 15a also has recesses 20 which are designed to co-operate with the hooks of the fixing tabs 14c to hold said half-boxes 14 and 15 together.

The box 13 may advantageously also have external projections (not shown) shaped to enable it to be fixed to a vehicle, e.g. fixing tabs or lugs.

FIGS. 3 to 7 show the various steps in assembling the module of FIG. 1.

The box 13 is initially open and the tongues 7 and the pins 4 are inserted into their respective housings 18 (FIG. 3).

The control card 2 is then inserted into its housing 17 (FIG. 4).

Thereafter the card 1 of the power circuit is put into place on the ends of said tongues 7 and pins 4 (FIG. 4).

Once the card 1 has been positioned on the tongues 7 and the pins 4, the half-box 15a is turned over and the power components which are to be soldered directly to the card 1, such a the relay 10, are put into position thereon (FIG. 6).

Thereafter, flow soldering is performed on the face of the card 1 through which there project the ends of the tongues 7, the pins 4, and the power components such as the relay 10, thereby making all the bonds required for obtaining the desired electrical circuit (soldering in the direction of the arrow in FIG. 7).

Thereafter the two half-boxes 15a and 14a are closed together.

In the embodiment described above with reference to FIGS. 3 to 7, it is assumed that the printed circuit 3 of the power card 1 is of the rigid type. In a variant, it is naturally possible to use a circuit 3 of the flexible type and pressed along a plane inside surface of the box 13, such as the inside surface of the half-box 14, for example.

The flexible circuit can be fixed to said surface by adhesive or by hot crimping studs integrally molded with the box and passing-through holes in the flexible circuit.

The soldering shown in FIG. 7 serves to bond pairs of components together. However, soldering using a single layer of copper may be insufficient to make the entire circuit that is required. In which case, it is possible to use a double-sided power circuit, or a stack of single-sided circuits.

FIG. 8 shows an assembly in which the card 1 is made up of two single-sided circuits 21a and 21b stacked on each other. In this assembly, a first tongue 7a is connected to the first circuit 21a and is connected to a pin 4 via a layer of copper 22 of said first circuit 21a. The pin 4 is connected to a tongue 7b via a layer of copper 23 on the second circuit 21b.

With such an assembly using a stack of circuits, it is possible to solder a single element to two or even more superposed circuits, thereby making it possible to provide links that cross one another and to increase the complexity of the circuits that can be made.

For this purpose, the leads of the tongues or pins are preferably stepped over a plurality of levels corresponding to the various layers of the circuits.

Figure 9:
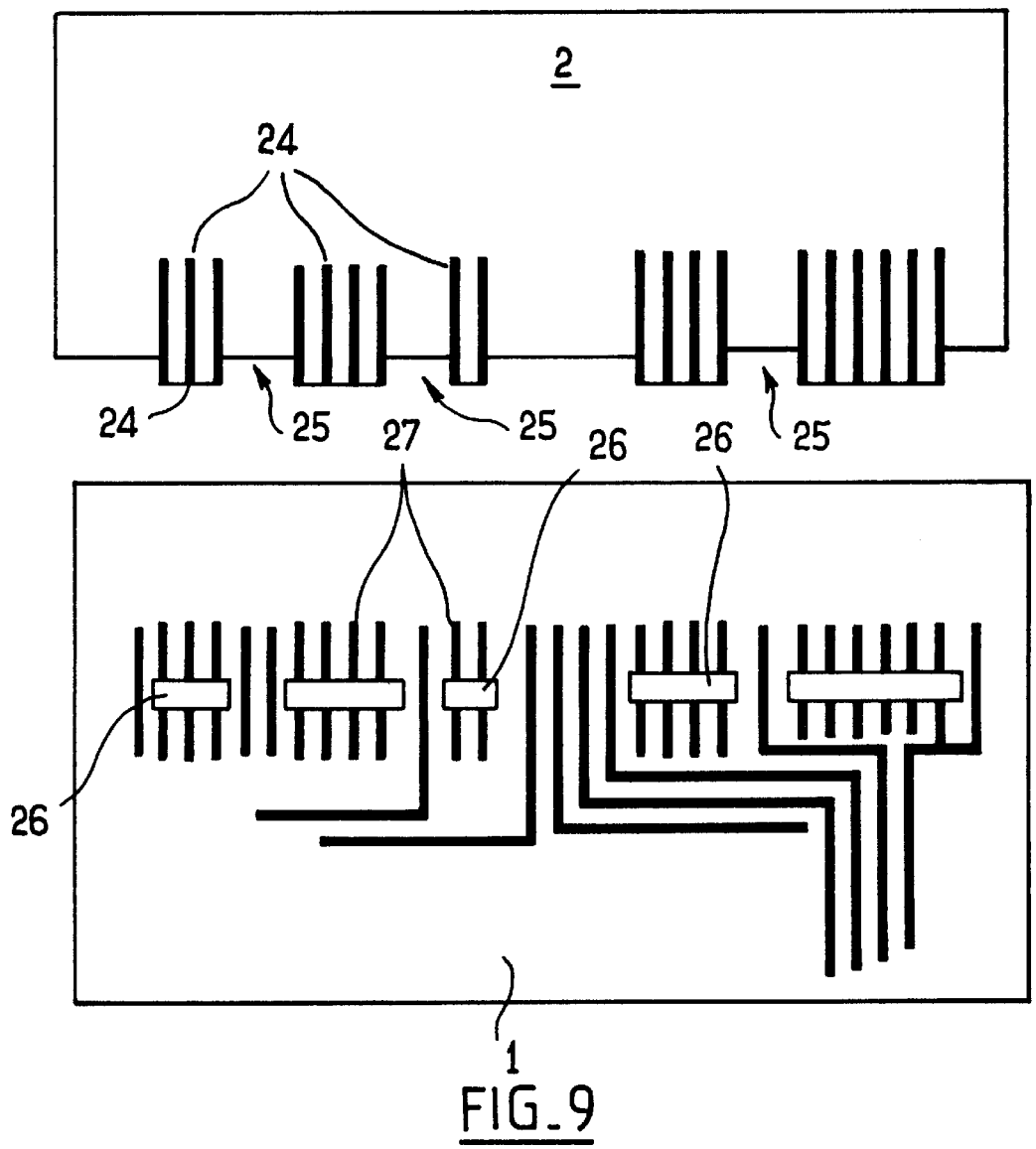
FIG. 9 is a diagram showing an embodiment of the link between the control card and the power card.

FIG. 9 shows one way of linking the control card 2 to the power card 1 in which use is made of a plurality of tracks 24 situated on the control card 2 and extending beyond said card 2 to constitute tracks passing through the power card 1 in order to provide the links between said cards. To this end, notches 25 are cut in the edge of the card 2 between its zones on which the tracks 24 extend, and the card 1 has a plurality of slots 26 designed to receive the portions between said notches 25 carrying said tracks 24 so that they project from the card 2.

The card 1 has its own tracks 27 on either side of said slots 26 in register with said tracks 24 when the card 2 is in place on the card 1, and to which said tracks 24 are connected.

In this way, the control card 2 can be connected to the power substrate while keeping layout options open on the power card and without making use of a connector or coupling piece.

What is claimed is:

1. A motor vehicle cab control module, comprising a box having at least one control card inserted therein, said at least one control card extending substantially perpendicular to a power card operatively connected to said box, wherein said box comprises two half-boxes connected therebetween with an hinge, wherein first of said two half-boxes extends on first side of said power card and second of said two half-boxes extends on second side of said power card, wherein said two half-boxes are capable of being closed together on said power card to define a power card housing, said first of said two half-boxes being integral with a control card housing case which extends perpendicularly to said power card housing and which receives the control card therein and provides protection therefor, the control module further comprising at least one connector, said at least one connector having at least one tongue and at least one female pin extending from said power card and inserted into at least one housing, said at least one housing extending from a half box, the half box being integral with the control card housing case and defining guiding skirts for said connectors.

2. The control module according to claim 1, wherein the power card comprises a plurality of superposed single-sided printed circuits.

3. The control module according to claim 1, wherein the power card comprises a flexible printed circuit.

4. The control module according to claim 1, wherein said one of the half-boxes further comprises at least one housing for a component that is soldered directly to the power card.

5. A module according to claim 1, wherein the control card has a side edge configured with notches and has a plurality of conductive tracks thereon, the plurality of conductive tracks extending to an edge of the notches.

6. A module according to claim 5, wherein the power card has a plurality of slots configured to receive said notches, and a plurality of conductive tracks thereon extending to an edge of each of said slots configured to make contact with the conductive tracks on the control card.

* * * * *